(12) United States Patent
Zhang et al.

(10) Patent No.: US 11,131,712 B2
(45) Date of Patent: Sep. 28, 2021

(54) DEVICE AND METHOD FOR INSPECTING A CONDITION OF ROTOR WINDINGS OF A GENERATOR

(71) Applicant: SHANDONG GUTE ELECTRIC CO., LTD., Zibo (CN)

(72) Inventors: Yuewu Zhang, Zibo (CN); Chicheng Liu, Zibo (CN); Jingrong Chen, Zibo (CN); Genyin Wu, Zibo (CN); Xu Han, Zibo (CN); Lixin Lu, Zibo (CN); Juncheng Dong, Zibo (CN); Yuqing Wei, Zibo (CN); Kunpeng Tian, Zibo (CN); Fengjun Wang, Zibo (CN); Jianxi Liu, Zibo (CN); Yanxu Sun, Zibo (CN); Zhen Lv, Zibo (CN); Jianfeng Sun, Zibo (CN); Pian Zhang, Zibo (CN)

(73) Assignee: SHANDONG GUTE ELECTRIC CO., LTD., Zibo (CN)

( * ) Notice: Subject to any disclaimer, the term of this patent is extended or adjusted under 35 U.S.C. 154(b) by 0 days.

(21) Appl. No.: 16/975,413

(22) PCT Filed: Aug. 17, 2018

(86) PCT No.: PCT/CN2018/101113
§ 371 (c)(1),
(2) Date: Aug. 25, 2020

(87) PCT Pub. No.: WO2020/015045
PCT Pub. Date: Jan. 23, 2020

(65) Prior Publication Data
US 2020/0400746 A1    Dec. 24, 2020

(30) Foreign Application Priority Data
Jul. 16, 2018 (CN) .......................... 201810777326.3

(51) Int. Cl.
*G01R 31/34* (2020.01)
(52) U.S. Cl.
CPC .................................. *G01R 31/346* (2013.01)
(58) Field of Classification Search
CPC .................................................... G01R 31/346
(Continued)

(56) References Cited

U.S. PATENT DOCUMENTS

| 6,529,135 | B1 * | 3/2003 | Bowers | ................. H02P 29/024 |
| | | | | 340/648 |
| 6,720,792 | B2 * | 4/2004 | Raftari | .................... B60L 50/16 |
| | | | | 324/765.01 |
| 2017/0292996 | A1 * | 10/2017 | Desabhatla | ........... H02P 29/024 |

FOREIGN PATENT DOCUMENTS

| CN | 104034255 A | 9/2014 |
| CN | 104360223 A | 2/2015 |

(Continued)

*Primary Examiner* — Giovanni Astacio-Oquendo
(74) *Attorney, Agent, or Firm* — Bayramoglu Law Offices LLC

(57) ABSTRACT

A device for inspecting the rotor windings of a generator includes a sequential logic circuit that generates a full-cycle pulse. A high-voltage full-cycle pulse matching generator couples the full-cycle pulse generated by the sequential logic circuit to form a corresponding transient bidirectional rotating magnetic field pulse. The transient bidirectional rotating magnetic field pulse is transmitted to two ends and a large shaft of the generator rotor winding through an impedance-matched connecting line. The transient bidirectional rotating magnetic field pulse generates a resonance effect with each large coil in the rotor. The pulse signal coupling feedback acquisition circuit couples all waveforms reflected by the generator rotor to form a magnetic field waveform, and the magnetic field waveform is transmitted to a data acquisition system by an operational amplifier. A central processing unit transmits a digital information stream to an upper computer.

10 Claims, 4 Drawing Sheets

(58) Field of Classification Search
USPC .......................................... 324/545, 537, 500
See application file for complete search history.

(56) References Cited

FOREIGN PATENT DOCUMENTS

| | | |
|---|---|---|
| CN | 104714153 A | 6/2015 |
| CN | 106019074 A | 10/2016 |
| CN | 106152922 A | 11/2016 |
| EP | 0608442 B1 | 8/1998 |

* cited by examiner

DEVICE AND METHOD FOR INSPECTING A CONDITION OF ROTOR WINDINGS OF A GENERATOR

CROSS REFERENCE TO THE RELATED APPLICATIONS

This application is the national phase entry of International Application No. PCT/CN2018/101113, filed on Aug. 17, 2018, which is based upon and claims priority to Chinese Patent Application No. 201810777326.3, filed on Jul. 16, 2018, the entire contents of which are incorporated herein by reference.

TECHNICAL FIELD

The present invention relates to a device and method for inspecting a condition of rotor windings of a generator, and belongs to the field of a single-end non-destructive detection of a large generator winding.

BACKGROUND

Rotors, like the ones used with large hydraulic, nuclear and thermal generators, for example, must be regularly inspected to determine wear and the need for maintenance. During overhaul of a rotor, the internal windings are first inspected to determine their condition relative to time of use. However, periodic inspection does not uncover faults in the windings that may have occurred between inspections. Sound and safe operation of the generator cannot, therefore, be guaranteed, which negatively affects production. Primary parameter detection is the current inspection method now used for assessing the condition of rotor windings of large generators. The secondary parameter detection only includes the AC impedance voltage division method and the recurrent surge oscillography (RSO) traveling wave method. The secondary parameter detection can be used to inspect a generator and detect changes in the rotor without disassembling the generator and removing the winding. Existing methods of inspection, however, have a relatively low detection accuracy with respect to the winding, and obtain less than precise assessment of the rotor. The winding cannot be detected in detail by existing instruments. If a detailed inspection is performed on each large coil, damage to the winding may occur. Probes may come into contact with the winding and cause breakage. The rotor of a large generator is often worth tens or even hundreds of millions CNY. Therefore it is unacceptable to use probes for detailed inspection of rotor windings in an unscientific and non-standard manner.

SUMMARY

The purpose of the present invention is to provide a device and method for inspecting the condition of a generator rotor winding, which device and method can perform a non-destructive test on the health status of each large coil of one or multiple pole pairs of rotors of a large generator. And, in the case of a single-end wiring measurement, can accurately judge subtle changes in the initiation period, the development period and the failure period of rotor winding fault points at the time domain position, and which can be established as standard electrical test parameters for each overhaul.

In order to solve the above problems, the present invention provides a device and method for inspecting a condition of generator rotor windings, wherein the device includes a central processing unit, a storage unit, a sequential logic circuit, a high-voltage full-cycle pulse matching generator, a pulse signal coupling feedback acquisition circuit, a data acquisition system, an upper computer management system and a waveform data analysis system. The central processing unit controls the sequential logic circuit. The sequential logic circuit is connected to the high-voltage full-cycle pulse matching generator. The high-voltage full-cycle pulse matching generator applies a waveform to a generator rotor. The pulse signal coupling feedback acquisition circuit collects the waveform reflected by the generator rotor and transmits it to the data acquisition system through an operational amplifier. The data acquisition system converts a magnetic field signal into digital information. The central processing unit transmits the digital information to an upper computer. The upper computer is connected to the waveform data analysis system.

The sequence circuit is configured to realize generation and switching of a specific test sequential waveform, data acquisition, data transmission, and buffering.

The high-voltage full-cycle pulse matching generator is configured to couple a digital waveform generated by the sequential logic circuit to form a transient bidirectional rotating magnetic field pulse matching a load, and the transient bidirectional rotating magnetic field pulse is applied to the generator rotor.

The pulse signal coupling feedback acquisition circuit is configured to couple all waveforms reflected by the generator rotor to form a magnetic field waveform, and the magnetic field waveform is transmitted to an acquisition part through the operational amplifier.

The data acquisition system is configured to convert a transient signal amplified by the operational amplifier into a digital information stream by direct memory access (DMA), store the digital information stream in a buffer, and transmit the digital information stream to the upper computer.

The upper computer management system is configured to transfer all controllable parameters to the central processing unit, and collect all data in real time.

The waveform data analysis system is configured to synthesize functions of background storage, processing, printing, and output.

Specifically, the central processing unit is used for system communication, execution, and interaction coordination.

Further, the device includes a human-machine interface and a storage unit, and the human-machine interface and the storage unit are connected to the central processing unit, respectively.

Further, the human-machine interface is configured to achieve functions of human-machine interaction, including inputting information, changing a mode and an on-off state. The storage unit is configured to achieve functions of temporary storage and acquisition state storage.

Further, in the device and method for inspecting the condition of generator rotor windings, when the transient bidirectional rotating magnetic field pulse passes through each large coil of the rotor, if a rotating direction of the transient bidirectional rotating magnetic field pulse is the same as a rotating direction of the coil, there will be a delayed wave characteristic. On the contrary, there will be an advanced wave characteristic; if start and end periods of a synthetic entire cycle are the same, there will be a corresponding transient superimposed total reflection wave at a time domain position of a corresponding large coil, each cycle waveform completely reflects transient electromagnetic characteristics of the corresponding large coil and truly reflects the health status of the large coil.

Specifically, the method includes the following steps:

(1) enabling the sequential logic circuit to generate a positive pulse with a controllable pulse width, and generate a delayed negative pulse after a controllable interval time, and forming a full-cycle pulse;

(2) enabling the high-voltage full-cycle pulse matching generator to couple the full-cycle pulse generated by the sequential logic circuit in the step (1) to form the transient bidirectional rotating magnetic field pulse matching the load;

(3) transmitting the transient bidirectional rotating magnetic field pulse to two ends and a large shaft of the rotor winding through an impedance-matched connecting line, and applying the transient bidirectional rotating magnetic field pulse between a positive pole and the large shaft and between a negative pole and the large shaft;

(4) enabling the transient bidirectional rotating magnetic field pulse to pass through the large coil of the rotor winding, producing a resonance effect with each large coil in the rotor, and forming a transient superimposed total reflection wave, wherein the transient superimposed total reflection wave contains an electromagnetic transient characteristic of each large coil;

(5) enabling the pulse signal coupling feedback acquisition circuit to couple the transient superimposed total reflection wave reflected by the generator rotor to form the magnetic field waveform, and transferring the magnetic field waveform to the upper computer;

(6) comparing test waveforms at two ends of the positive and negative poles, and judging true electromagnetic characteristics and health status of each large coil corresponding to the positive and negative poles according to the completely symmetrical electromagnetic characteristics of the positive and negative poles of the rotor.

The advantages of the present invention are as follows.

In a case of a single-end wiring measurement, the present invention can perform a non-destructive test on the health status of each large coil of one or multiple pole pairs of rotors of a large generator in a direct, simple and convenient manner. The high-voltage full-cycle pulse matching generator couples the digital waveform generated by the sequential logic circuit to form a transient bidirectional rotating magnetic field pulse matching the load and the transient bidirectional rotating magnetic field pulse is applied to the generator rotor. When the transient bidirectional rotating magnetic field pulse passes through each large coil of the rotor, if the rotating direction thereof is the same as the rotating direction of the coil, there will be a delayed wave characteristic. On the contrary, there will be an advanced wave characteristic; if the start and end periods of the synthetic entire cycle are the same, there will be a corresponding transient superimposed total reflection wave at the time domain position of a corresponding large coil. Each cycle waveform completely reflects the transient electromagnetic characteristics of the corresponding large coil, and truly reflects the health status of the large coil. The method of the present invention can accurately judge subtle changes in the initiation period and the development period of rotor winding fault points at the time domain position, and can be established as standard electrical test parameters for each overhaul. The rotor inspector can quickly position and analyze the weak points of the rotor, and judge the health status of the rotor.

DETAILED DESCRIPTION OF THE EMBODIMENTS

Embodiment 1

Figure 1:
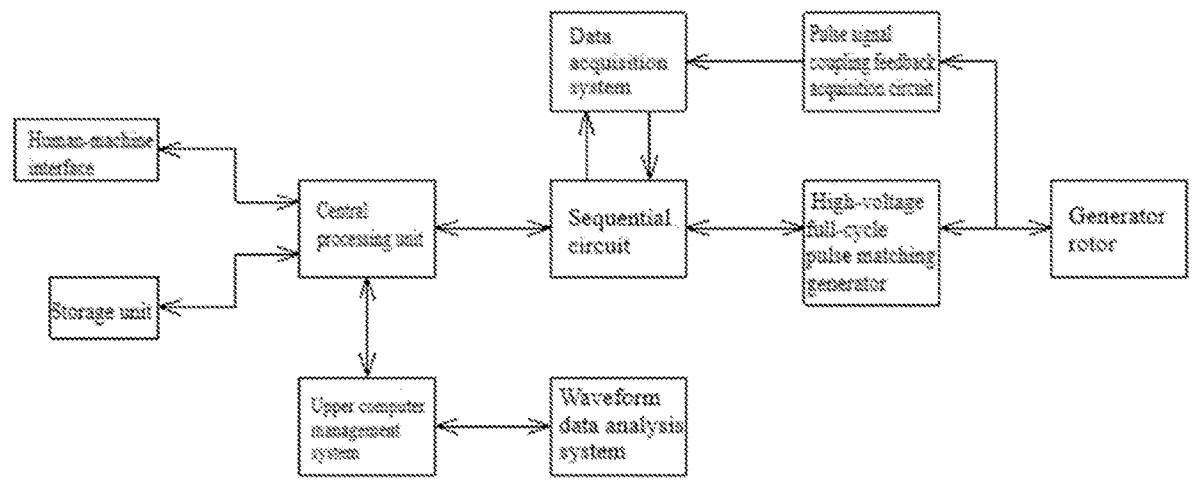
FIG. 1 is a schematic structural diagram of the present invention.

Referring to the drawings, the present invention provides a device and method for inspecting a condition of generator rotor windings, wherein the device includes a central processing unit, a storage unit, a sequential logic circuit, a high-voltage full-cycle pulse matching generator, a pulse signal coupling feedback acquisition circuit, a data acquisition system, an upper computer management system and a waveform data analysis system. The central processing unit controls the sequential logic circuit. The sequential logic circuit is connected to the high-voltage full-cycle pulse matching generator. The high-voltage full-cycle pulse matching generator applies a waveform to a generator rotor. The pulse signal coupling feedback acquisition circuit collects the waveform reflected by the generator rotor and transmits it to the data acquisition system through an operational amplifier. The data acquisition system converts a magnetic field signal into digital information. The central processing unit transmits the digital information to an upper computer. The upper computer is connected to the waveform data analysis system.

The sequence circuit realizes generation and switching of a specific test sequential waveform, data acquisition, data transmission, and buffering.

The high-voltage full-cycle pulse matching generator couples a digital waveform generated by the sequential logic circuit to form a transient bidirectional rotating magnetic field pulse matching a load and applying it to the generator rotor.

The pulse signal coupling feedback acquisition circuit couples all waveforms reflected by the generator rotor to form a magnetic field waveform, and transmits it to an acquisition part through the operational amplifier.

The data acquisition system converts a transient signal amplified by the operational amplifier into a digital information stream by DMA, stores it in a buffer, and transmits it to the upper computer.

The upper computer management system transfers all controllable parameters to the central processing unit, and collects all data in real time.

The waveform data analysis system synthesizes functions of background storage, processing, printing, and output.

Specifically, the central processing unit is used for system communication, execution, and interaction coordination.

Further, the device includes a human-machine interface and a storage unit, and the human-machine interface and the storage unit are connected to the central processing unit, respectively.

Further, the human-machine interface is configured to achieve functions of human-machine interaction, containing inputting information, changing a mode and an on-off state; the storage unit is configured to achieve functions of temporary storage and acquisition state storage.

Further, in the device and method for inspecting a condition of generator rotor windings, when the transient bidirectional rotating magnetic field pulse passes through each large coil of the rotor, if a rotating direction thereof is the same as a rotating direction of the coil, there will be a delayed wave characteristic. On the contrary, there will be an advanced wave characteristic; if start and end periods of a synthetic entire cycle are the same, there will be a corresponding transient superimposed total reflection wave at a time domain position of a corresponding large coil, each cycle waveform completely reflects transient electromagnetic characteristics of the corresponding large coil and truly reflects health status of the large coil.

Specifically, the method includes the following steps:

(1) the sequential logic circuit generates a positive pulse with a controllable pulse width, and generates a delayed negative pulse after a controllable interval time, and then the positive pulse and the delayed negative pulse form a full-cycle pulse;

(2) the high-voltage full-cycle pulse matching generator couples the full-cycle pulse generated by the sequential logic circuit in the step (1) to form the transient bidirectional rotating magnetic field pulse matching the load;

(3) the transient bidirectional rotating magnetic field pulse is transmitted to two ends and a large shaft of the rotor winding through an impedance-matched connecting line, and is applied between a positive pole and the large shaft and between a negative pole and the large shaft;

(4) the transient bidirectional rotating magnetic field pulse passes through the large coil of the rotor winding and produces a resonance effect with each large coil in the rotor to form a transient superimposed total reflection wave, which contains an electromagnetic transient characteristic of each large coil;

(5) the pulse signal coupling feedback acquisition circuit couples the transient superimposed total reflection wave reflected by the generator rotor to form the magnetic field waveform and transfers it to the upper computer;

(6) because the electromagnetic characteristics of the positive and negative poles of the rotor are completely symmetrical, by comparing test waveforms at two ends of the positive and negative poles, true electromagnetic characteristics and health status of each large coil corresponding to the positive and negative poles can be clearly judged.

Figure 2:
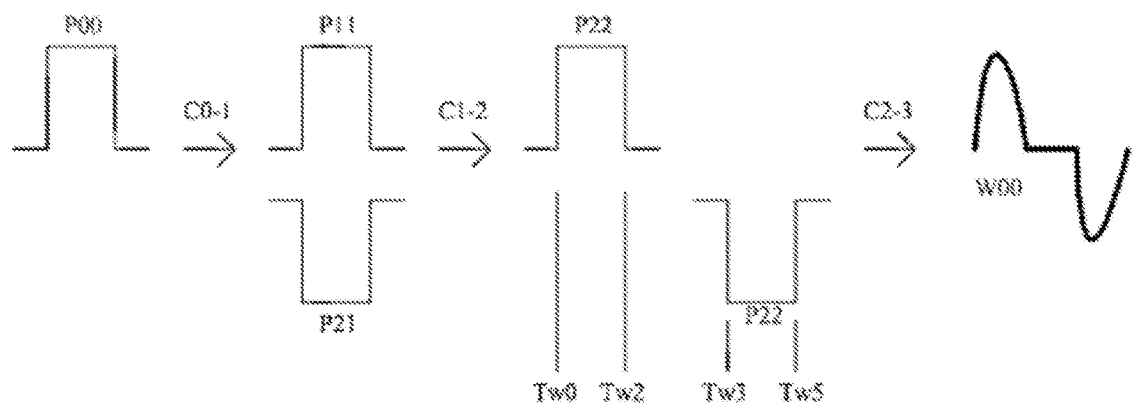
FIG. 2 is a schematic waveform diagram of a transient bidirectional rotating magnetic field pulse in Embodiment 1.
Figure 3:
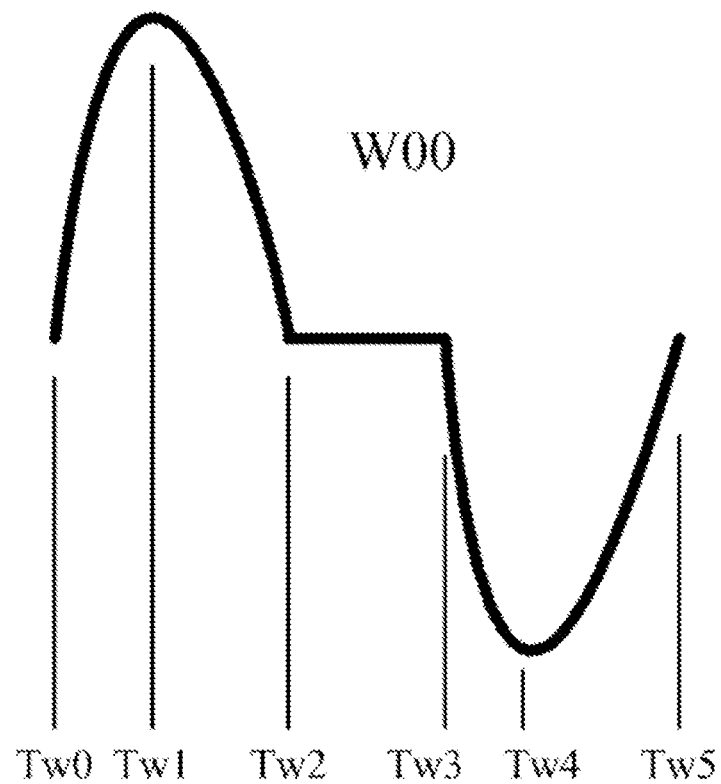
FIG. 3 is a schematic waveform diagram of a full-cycle pulse in Embodiment 1.

The specific working process is as follows. As shown in FIG. 2, P00 indicates a positive pulse with a controllable pulse width generated by the sequential logic circuit. P11&P21 indicates that the positive pulse P11 and the negative pulse P21 are generated at the same time through the circuit C0-1. P22&P22 indicates that the negative pulse P21 is delayed after passing through the circuit C1-2. W00 indicates that the actual transient bidirectional rotating magnetic field pulse is generated by the high-voltage full-cycle pulse matching generator through the circuit C2-3. As shown in FIG. 3, in the waveform W00, Tw0 is the starting timing of clockwise rotating the pulse along the axis, Tw1 is the time domain timing of clockwise rotating to 90° phase, Tw2 is the time domain timing of rotating the pulse to 180° phase, Tw3 is the starting time of the reversely rotating the pulse, Tw4 is the time domain timing of reversely rotating by 90° to 270° phase and Tw5 is the time domain timing of reversely rotating to 180° phase. The interval between Tw2 and Tw3 is adjusted by the total period and wavelength of the actual coupling coil. The circuits C0-1 and C1-2 are the sequential logic circuits, and the circuit C2-3 is the high-voltage full-cycle pulse matching generator.

Figure 4:
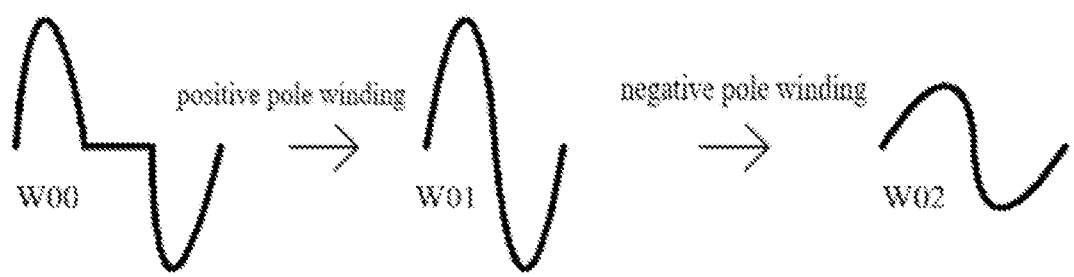
FIG. 4 is a schematic waveform diagram when the full-cycle pulse passes through the positive and negative windings of the rotor in Embodiment 1.

The transient bidirectional rotating magnetic field pulse is transmitted to two ends and the large shaft of the generator rotor winding through the impedance-matched connecting line. As shown in FIG. 4, W01 is the transient superimposed total reflection wave generated by coupling the transient bidirectional rotating magnetic field pulse on an entire large coil of the rotor winding. W02 is the reflected wave having a smaller amplitude and a wider pulse width after the transient bidirectional rotating magnetic field pulse passes through an inter-polar connecting line or a neutral point and is attenuated by a reversed large coil.

Figure 5:
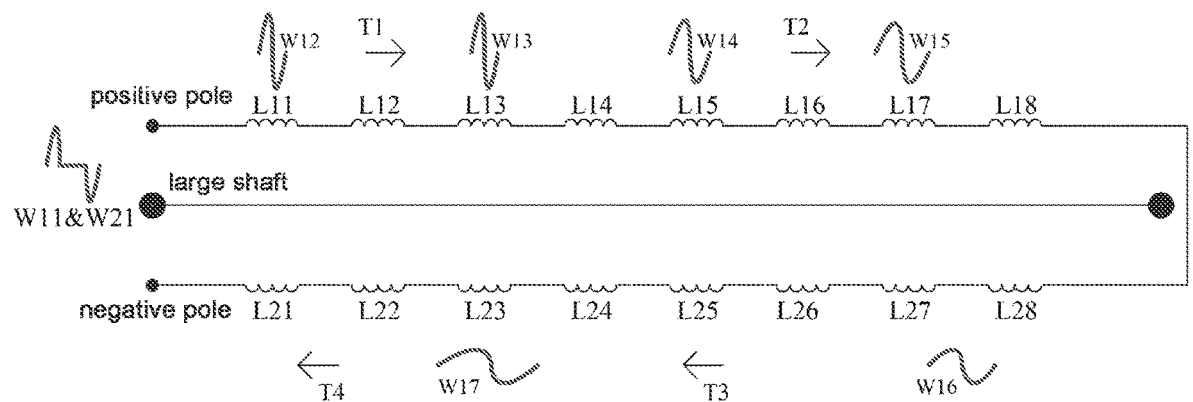
FIG. 5 is another waveform schematic diagram when the full-cycle pulse passes through the positive and negative windings of the rotor in Embodiment 1.

The device generates the emitted transient bidirectional rotating magnetic field pulses W11&W21 that are applied to the positive pole and the large shaft, and to the negative pole and the large shaft. As shown in FIG. 5, W12 is the transient superimposed total reflection wave generated by coupling on the entire large coil L11 of the rotor winding 1 #. The same is true on L12. W13 is the transient superimposed total reflection wave generated by coupling on the entire large coil L13 of the rotor winding 3 #. The same is true on L14. W14 is the transient superimposed total reflection wave generated by coupling on the entire large coil L15 of the rotor winding 5 #. The amplitude starts to be attenuated. W15 is the transient superimposed total reflection wave generated by coupling on the entire large coil L17 of the rotor winding 7 #. The amplitude continues to be attenuated, and the pulse wavelength becomes wider. The amplitude continues to be attenuated and the wavelength becomes wider on L18. W16 indicates that after passing through the inter-polar connecting line or the neutral point and being attenuated by the reversed large coil, the amplitude of W16 on L28 becomes smaller and the pulse width becomes wider. W17 indicates that near the headend of the negative pole, the transient superimposed total reflection wave is difficult to identify due to the attenuation of the waveform.

Because the electromagnetic characteristics of the positive and negative poles of the rotor are completely symmetrical, by means of comparing test waveforms at two ends of the positive and negative poles, true electromagnetic characteristics and health status of each large coil corresponding to the positive and negative poles can be clearly judged.

Figure 6:
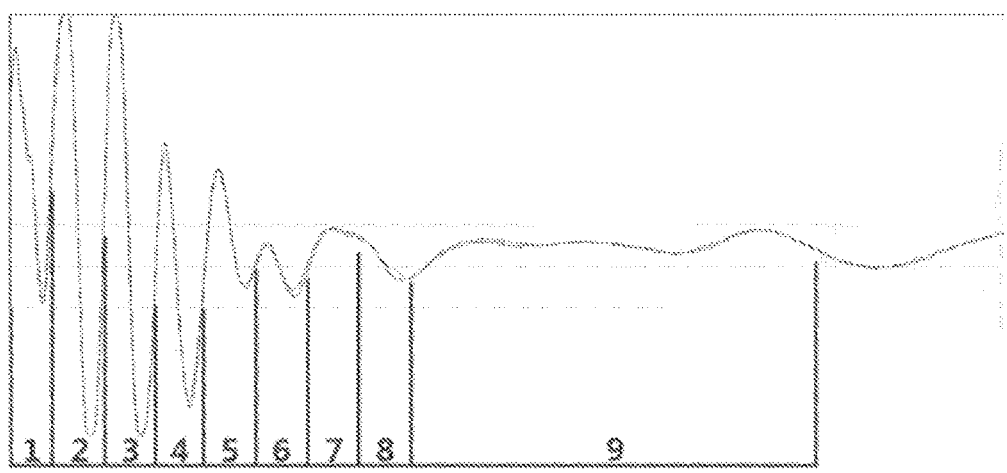
FIG. 6 is a schematic waveform diagram of a magnetic field in Embodiment 1.

As shown in FIG. 6, the positive and negative poles are completely coincident. Indicators 1-8 correspond to characteristic waveforms of the transient superimposed total reflection waves of the large coils 14 to 8 #, and 9 is the total reflection waveform of the corresponding symmetrical reverse polarity winding. All of 14 large coils (positive 1-74 and negative 1-74) are normal, the waveform of the positive large coil 8 # is normal, and the waveform of the negative large coil 8 # shows that there is a hidden danger of slot wedge looseness or contamination.

Embodiment 2

The device and method for solving the problem are the same as those in Embodiment 1, except for the waveform.

Figure 7:
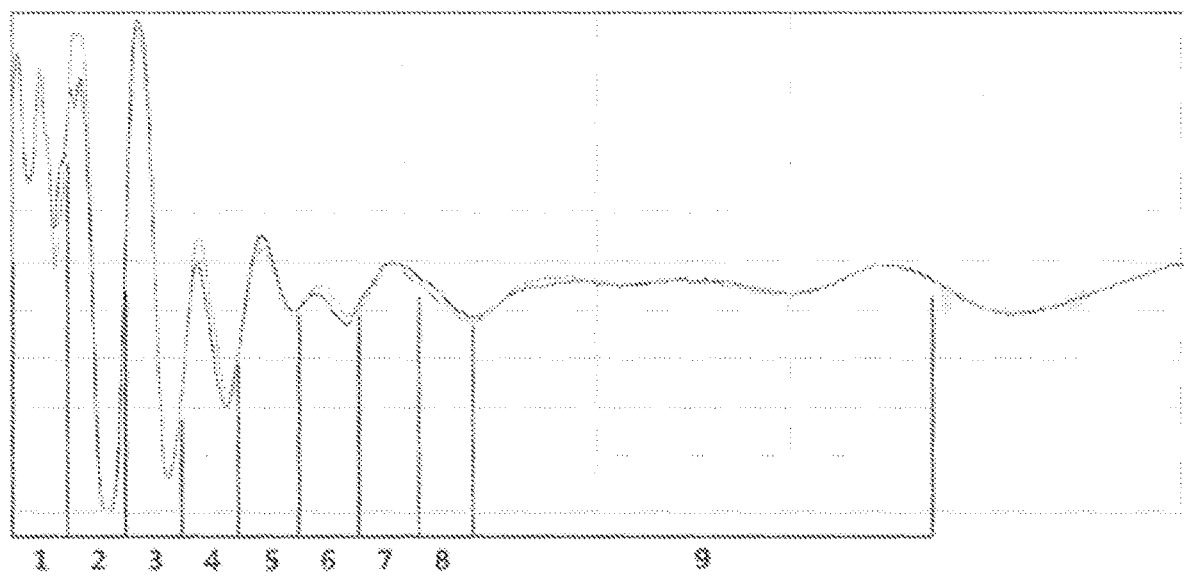
FIG. 7 is a schematic waveform diagram of a magnetic field in Embodiment 2.

As shown in FIG. 7, except for the positive 1-2 # and negative 1-2 #1 coils, the remaining are basically coincident. 1-8 correspond to characteristic waveforms of the transient superimposed total reflection waves of the coils 14 to 8 #, and 9 is the reflection waveform of the total reflection wave of the corresponding symmetrical reverse polarity winding.

According to this waveform, it can be judged that the light color waveform negative pole winding has a hidden danger of slot wedge looseness or contamination at the tail of the 14 coil and the front of the 2 # coil, and the remaining 14 large coils are normal.

The above are only embodiments of the present invention and do not limit the patent scope of the present invention. Any equivalent modification on structure or process according to the description and drawings of the present invention, or that directly or indirectly used in other related technical fields, is included in the patent protection scope of the present invention.

What is claimed is:

1. A device for inspecting a condition of rotor windings of a generator, comprising a central processing unit, a storage unit, a sequential logic circuit, a high-voltage full-cycle pulse matching generator, a pulse signal coupling feedback acquisition circuit, a data acquisition system, an upper computer management system and a waveform data analysis system; wherein, the central processing unit controls the sequential logic circuit, the sequential logic circuit is connected to the high-voltage full-cycle pulse matching generator, the high-voltage full-cycle pulse matching generator applies a waveform to a generator rotor, the pulse signal coupling feedback acquisition circuit collects the waveform reflected by the generator rotor and transmits the waveform to the data acquisition system through an operational amplifier; the data acquisition system converts a magnetic field signal into digital information, the central processing unit transmits the digital information to an upper computer, the upper computer is connected to the waveform data analysis system;

the sequence circuit is configured to realize generation and switching of a specific test sequential waveform, data acquisition, data transmission, and buffering;

the high-voltage full-cycle pulse matching generator is configured to couple a digital waveform generated by the sequential logic circuit to form a transient bidirectional rotating magnetic field pulse matching a load, and apply the transient bidirectional rotating magnetic field pulse to the generator rotor;

the pulse signal coupling feedback acquisition circuit is configured to couple all waveforms reflected by the generator rotor to form a magnetic field waveform, and transmit the magnetic field waveform to an acquisition part through the operational amplifier;

the data acquisition system is configured to convert a transient signal amplified by the operational amplifier into a digital information stream by direct memory access (DMA), store the digital information stream in a buffer, and transmit the digital information stream to the upper computer;

the upper computer management system is configured to transfer all controllable parameters to the central processing unit, and collect all data in real time; and the waveform data analysis system is configured to synthesize functions of background storage, processing, printing, and output.

2. The device according to claim 1, wherein, the central processing unit is used for system communication, execution, and interaction coordination.

3. The device according to claim 2, wherein, further comprising a human-machine interface, and the human-machine interface and the storage unit are connected to the central processing unit, respectively.

4. The device according to claim 3, wherein, the human-machine interface is configured to achieve functions of human-machine interaction, and the functions of human-machine interaction contains inputting information, changing a mode and an on-off state; the storage unit is configured to achieve functions of temporary storage and acquisition state storage.

5. The device according to claim 1, wherein, when the transient bidirectional rotating magnetic field pulse passes through each coil of the generator rotor, if a rotating direction of the transient bidirectional rotating magnetic field pulse is the same as a rotating direction of a coil, there will be a delayed wave characteristic; if the rotating direction of the transient bidirectional rotating magnetic field pulse is the same as the rotating direction of the coil, there will be an advanced wave characteristic; if start and end periods of a synthetic entire cycle are the same, there will be a corresponding transient superimposed total reflection wave at a time domain position of a corresponding coil, each cycle waveform completely reflects transient electromagnetic characteristics of the corresponding coil and truly reflects health status of the coil.

6. A method for inspecting the condition of the rotor windings of the generator according to claim 1, comprising the following steps:

(1) enabling the sequential logic circuit to generate a positive pulse with a controllable pulse width, and generate a delayed negative pulse after a controllable interval time, and then forming a full-cycle pulse;

(2) enabling the high-voltage full-cycle pulse matching generator to couple the full-cycle pulse generated by the sequential logic circuit in the step (1) to form the transient bidirectional rotating magnetic field pulse matching the load;

(3) transmitting the transient bidirectional rotating magnetic field pulse to two ends and a shaft of the rotor winding through an impedance-matched connecting line, and applying the transient bidirectional rotating magnetic field pulse between a positive pole and the shaft and between a negative pole and the shaft;

(4) enabling the transient bidirectional rotating magnetic field pulse to pass through a coil of the generator rotor winding, producing a resonance effect with each coil in the generator rotor, and forming a transient superimposed total reflection wave, wherein the transient superimposed total reflection wave contains an electromagnetic transient characteristic of the each coil;

(5) the pulse signal coupling feedback acquisition circuit couples the transient superimposed total reflection wave reflected by the generator rotor to be the magnetic field waveform and transfers it to the upper computer;

(6) comparing test waveforms at two ends of the positive and negative poles, judging true electromagnetic characteristics of each large coil corresponding to the positive and negative poles can be clearly judged according to symmetry of the true electromagnetic characteristics of the positive and negative poles of the generator rotor, and judging the health status of the generator rotor.

7. The method according to claim 6, wherein, the central processing unit is used for system communication, execution, and interaction coordination.

8. The method according to claim 7, wherein, the device further comprises a human-machine interface, and the human-machine interface and the storage unit are connected to the central processing unit, respectively.

9. The method according to claim 8, wherein, the human-machine interface is configured to achieve functions of human-machine interaction, and the functions of human-machine interaction contains inputting information, changing a mode and an on-off state; the storage unit is configured to achieve functions of temporary storage and acquisition state storage.

10. The method according to claim 6, wherein, when the transient bidirectional rotating magnetic field pulse passes through the each coil of the generator rotor, if a rotating direction of the transient bidirectional rotating magnetic field pulse is the same as a rotating direction of the coil, there will be a delayed wave characteristic; if the rotating direction of the transient bidirectional rotating magnetic field pulse is the same as the rotating direction of the coil, there will be an advanced wave characteristic; if start and end periods of a synthetic entire cycle are the same, there will be a corresponding transient superimposed total reflection wave at a time domain position of a corresponding coil, each cycle waveform completely reflects transient electromagnetic characteristics of the corresponding coil and truly reflects health status of the coil.

\* \* \* \* \*